United States Patent [19]
Yung

[11] Patent Number: 5,506,543
[45] Date of Patent: Apr. 9, 1996

[54] CIRCUITRY FOR BIAS CURRENT GENERATION

[75] Inventor: Henry T. Yung, Richardson, Tex.

[73] Assignee: Texas Instruments Incorporated, Dallas, Tex.

[21] Appl. No.: 355,714

[22] Filed: Dec. 14, 1994

[51] Int. Cl.⁶ ..................................................... H03F 3/45
[52] U.S. Cl. ........................... 330/253; 330/257; 323/316
[58] Field of Search ................................... 330/253, 257, 330/261, 292, 259; 323/313, 314, 315, 316

[56] References Cited

U.S. PATENT DOCUMENTS

| | | | |
|---|---|---|---|
| 4,410,857 | 10/1983 | Olmstead | 330/253 |
| 4,987,379 | 1/1991 | Hughes | 330/253 |
| 5,384,740 | 1/1995 | Etoh et al. | 323/313 X |

Primary Examiner—Steven Mottola
Attorney, Agent, or Firm—Alan K. Stewart; Richard L. Donaldson; William E. Hiller

[57] ABSTRACT

The circuit for generating current has a controllable current source $M_7$, an input transistor pair 24 having a first branch and a second branch, a current mirror 28 having a first branch and a second branch, and an amplifier 50. The controllable current source $M_7$ is coupled to the first and second branches of the input transistor pair 24. The first branch of the current mirror 28 is coupled to the first branch of the input transistor pair 24. The second branch of the current mirror 28 is coupled to the second branch of the input transistor pair 24. The input transistor pair 24 is coupled between the controllable current source $M_7$ and the current mirror 28. The amplifier 50 has an output coupled to the controllable current source $M_7$, and a first input coupled to the second branch of the input transistor pair 24 and the second branch of the current mirror 28.

18 Claims, 2 Drawing Sheets

CIRCUITRY FOR BIAS CURRENT GENERATION

FIELD OF THE INVENTION

This invention generally relates to electronic systems and in particular it relates to bias current generation for electronic systems.

BACKGROUND OF THE INVENTION

A variety of integrated circuit devices, such as operational amplifiers, require the generation of a stable bias current by a portion of the device. The bias current is used to set the magnitude of the currents used to power the various components of the device. It is very important that the bias current remain as near as possible to a predetermined level to insure that the total current required by the integrated circuit device is predictable.

A variety of forces acting upon the integrated circuit device can create fluctuations in the bias current level. Three significant forces are the ambient temperature in which the device is operating, which causes bias current fluctuations, and the variations which are introduced in the device during the construction of the device, which affect the magnitude of the bias current, and supply voltage variations.

SUMMARY OF THE INVENTION

Generally, and in one form of the invention, a circuit for generating current has a controllable current source, an input transistor pair, a current mirror, and an amplifier. The controllable current source is coupled to the first and second branches of the input transistor pair. The first branch of the current mirror is coupled to the first branch of the input transistor pair. The second branch of the current mirror is coupled to the second branch of the input transistor pair. The input transistor pair is coupled between the controllable current source and the current mirror. The amplifier has an output coupled to the controllable current source, and a first input coupled to the second branch of the input transistor pair and the second branch of the current mirror.

This invention provides several advantages. One advantage of this invention is that it is insensitive to body effect of transistors. Another advantage is that it can generally be used to control behavior of the drain saturation voltage of transistors.

DETAILED DESCRIPTION OF PREFERRED EMBODIMENTS

Figure 1:
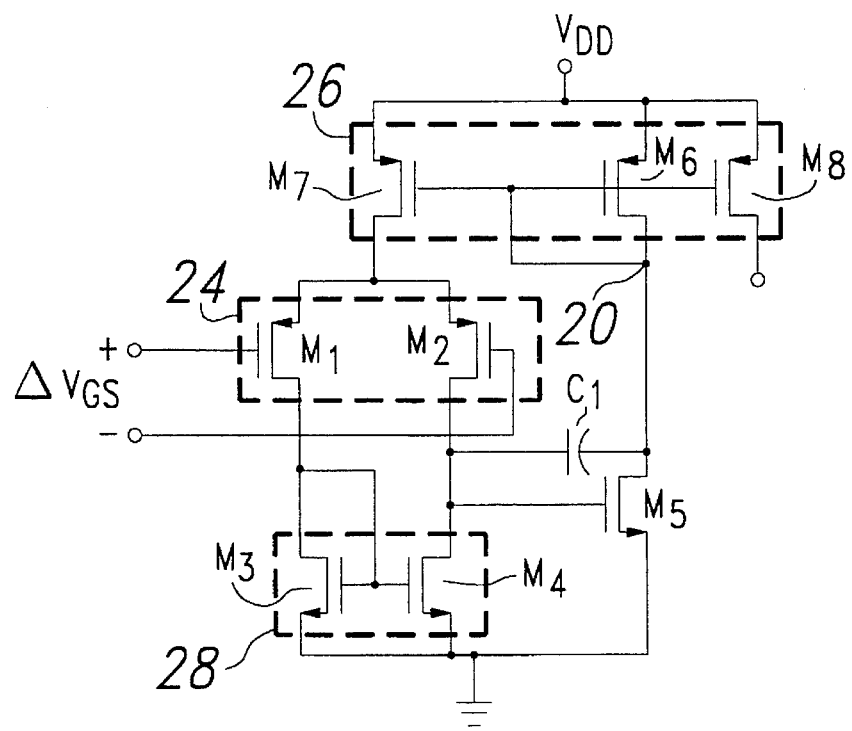
FIG. 1 is a schematic diagram of a first preferred embodiment bias current circuit.

Referring to FIG. 1, a circuit diagram of a first preferred embodiment bias current circuit according to the invention is shown. The circuit includes MOSFET's $M_1$–$M_8$, capacitor $C_1$, input voltage $\Delta V_{GS}$, and bias voltage $V_{DD}$. In this embodiment, transistors $M_1$, $M_2$, $M_6$, $M_7$, and $M_8$ are p-channel transistors. Transistors $M_3$, $M_4$, and $M_5$ are n-channel transistors. Transistors $M_1$ and $M_2$ each form a branch of the input transistor pair 24. Transistors $M_6$–$M_8$ each form a branch of the current mirror 26 that is controlled by the voltage at node 20. Transistors $M_3$ and $M_4$ each form a branch of the current mirror 28 that is controlled by the voltage at node 22.

In the first preferred embodiment bias current circuit, shown in FIG. 1, let the width-to-length ratio of transistor $M_n$ be given by $(W/L)_n$, where $n=1, 2, \ldots, 8$. Let $(W/L)_3 = (W/L)_4 = (W/L)_5$, $(W/L)_6 = 1/2(W/L)_7 = (W/L)_8$, $(W/L)_1 > (W/L)_2$. All the transistors are biased at the saturation region. With a positive voltage of $\Delta V_{GS}$ applied across the gates of $M_1$ and $M_2$, $$\begin{aligned} \Delta V_{GS} &= |V_{GS2} - V_{GS1}| \\ &= |(V_{GS2} - V_T) - (V_{GS1} - V_T)| \\ &= \sqrt{\frac{2I_1}{\mu C_{OX}\left(\frac{W}{L}\right)_2}} - \sqrt{\frac{2I_1}{\mu C_{OX}\left(\frac{W}{L}\right)_1}} \end{aligned}$$

$V_{GS2}$ is the gate to source voltage for transistor $M_2$. $V_{GS1}$ is the gate to source voltage for transistor $M_1$. $V_T$ is the threshold voltage for transistors $M_2$ and $M_1$. $\mu$ is the majority carrier mobility. $C_{OX}$ is the gate capacitance per unit area of transistors $M_2$ and $M_1$. $I_1$ is the current flowing through transistors $M_1$ and $M_2$.

The following equation for the current $I_1$ is then derived from the above equation for $\Delta V_{GS}$:

$$I_1 = \frac{\mu C_{OX}}{2} \cdot \frac{\left(\frac{W}{L}\right)_2}{\left(1 - \sqrt{\frac{(W/L)_2}{(W/L)_1}}\right)^2} (\Delta V_{GS})^2$$

The above equation shows that the current $I_1$ is proportional to the square of $\Delta V_{GS}$. When this current is used to bias a transistor $M_X$ with the same $\mu C_{OX}$ in the saturation region, $$|(V_{GSX} - V_T)| = \sqrt{\frac{2I_1}{\mu C_{OX}\left(\frac{W}{L}\right)_X}} = K(\Delta V_{GS})$$

where $$K = \frac{\sqrt{\frac{(W/L)_2}{(W/L)_X}}}{\left(1 - \sqrt{\frac{(W/L)_2}{(W/L)_1}}\right)}$$

The factor K is independent of temperature and well controlled since it depends only on the width-to-length ratios of the transistors. Thus, $|V_{GSX} - V_T|$ is directly proportional to $\Delta V_{GS}$. Different useful properties can be obtained from the current $I_1$ depending on the nature of $\Delta V_{GS}$. Two of the possible applications are described below.

Figure 2:
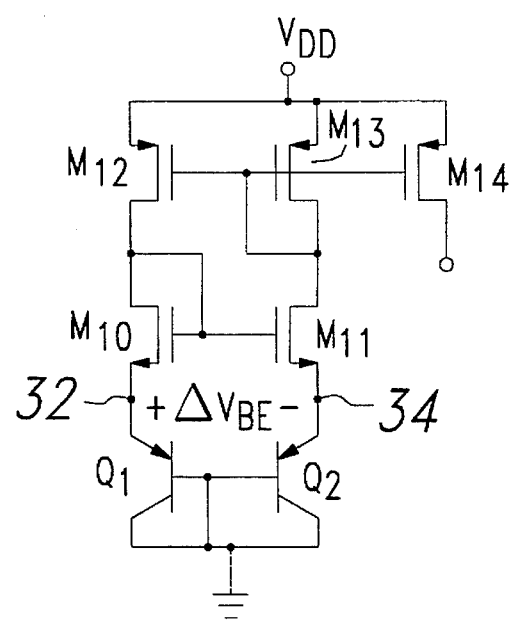
FIG. 2 is a schematic diagram of a prior art bias current circuit.

One application of the first preferred embodiment of FIG. 1 is an enhancement of a prior art bias circuit. The basic structure of the prior art bias circuit is shown in FIG. 2. The prior art circuit of FIG. 2 includes MOSFET's $M_{10}$–$M_{14}$; bipolar transistors $Q_1$ and $Q_2$; $\Delta V_{BE}$ voltage between nodes 32 and 34; and bias voltage $V_{DD}$. The channel width-to-length ratio of MOSFET $M_{10}$ is 2 times that of MOSFET $M_{11}$. Bipolar transistor $Q_2$ is 10 times the size of bipolar transistor $Q_1$. MOSFET's $M_{12}$, $M_{13}$, and $M_{14}$ all have the same channel width-to-length ratio. With the same amount of current $I_2$ going through the bipolar transistors $Q_1$ and $Q_2$, the voltage $\Delta V_{BE}$ is relatively insensitive to the absolute value of $I_2$. The current $I_2$ is given approximately by the following equation:

$$I_2 = \frac{\mu C_{0X}}{2} \frac{\left(\frac{W}{L}\right)_{11}}{\left(1 - \sqrt{\frac{(W/L)_{11}}{(W/L)_{10}}}\right)^2} (\Delta V_{BE})^2$$

In the prior art circuit of FIG. 2, $M_{10}$ and $M_{11}$ tend to have different $V_T$'s (threshold voltages) due to the body effect. This can generate quite a significant amount of error in the current $I_2$. This problem can be solved by using the circuit in FIG. 1 with $\Delta V_{BE}$ applied as $\Delta V_{GS}$ in the equation for $I_1$. In FIG. 1, since $M_1$ and $M_2$ have their sources tied together, their $V_T$'s tend to match. In addition, the voltage $\Delta V_{BE}$ can be easily multiplied with various circuit techniques before being applied as $\Delta V_{GS}$ in FIG. 1, thus adding flexibility to circuit implementation.

Another application of the first preferred embodiment, shown in FIG. 1, is obtained by applying a temperature independent voltage as $\Delta V_{GS}$ in FIG. 1. This voltage can be derived, for example, from a bandgap voltage reference. From the equation above for $(V_{GSX}-V_T)$, it can be seen that $(V_{GSX}-V_T)$ will then be independent of temperature. When this current is used to bias an operational amplifier with the input transistors having the same $\mu C_{OX}$, any temperature independent input offset voltage can be corrected by steering different portions of current through the input transistors. This correction will remain valid under different temperatures. To achieve the same $\mu C_{OX}$, the same type of input transistors ($M_1$ and $M_2$) can be used in the bias circuit shown in FIG. 1. For instance, an N-channel input pair can be used in the bias circuit to match an N-channel input pair in an operational amplifier.

Of course, the applications of the first preferred embodiment of FIG. 1 are not limited to the ones described above. The structure shown in FIG. 1 can obviously be flipped over with N-channel transistors as the input pair ($M_1$ and $M_2$). Cascode transistors can be added to enhance the performance of this bias circuit. In general, a start-up circuit may be desired to make the bias circuit operate in the proper region. Compensation will also be needed to keep the bias circuit stable. This is accomplished by the compensation capacitor $C_1$ shown in FIG. 1.

Figure 3:
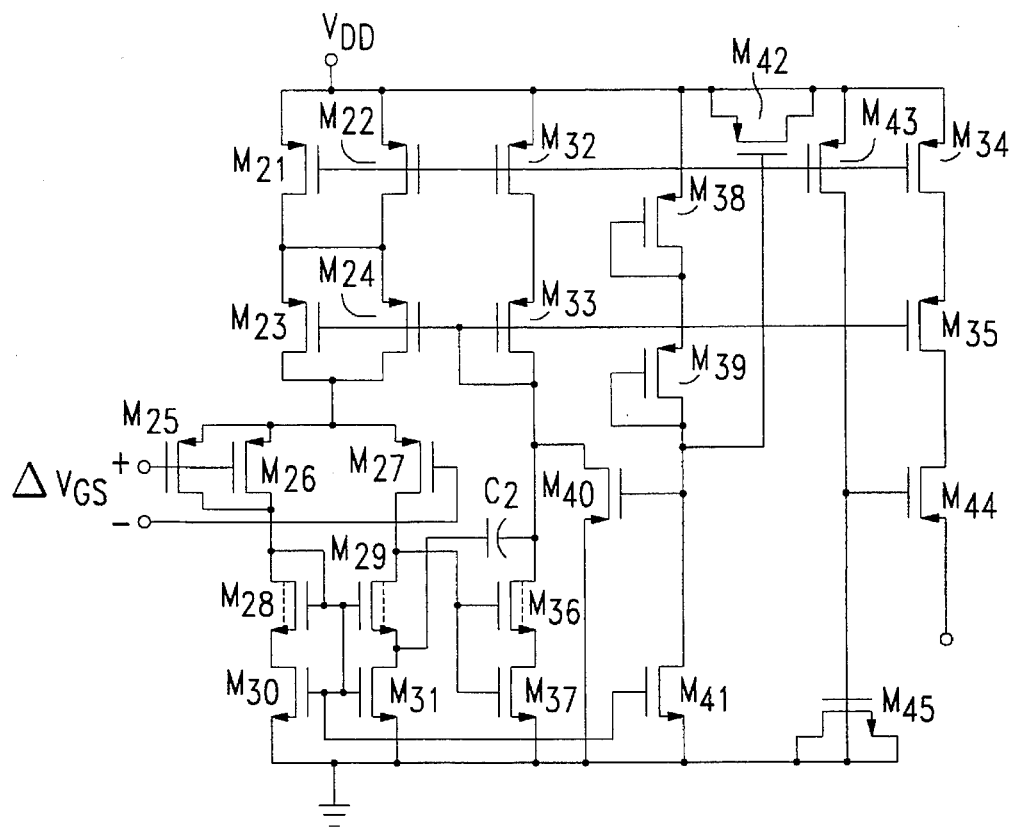
FIG. 3 is a schematic diagram of a second preferred embodiment bias current circuit.

Referring to FIG. 3, a circuit diagram of a second preferred embodiment bias current circuit according to the invention is shown. The circuit includes MOSFET's $M_{21}$-$M_{45}$, capacitor $C_2$, input voltage $\Delta V_{GS}$, and bias voltage $V_{DD}$.

The second preferred embodiment, shown in FIG. 3, operates in the same way as the first preferred embodiment, shown in FIG. 1. Transistors $M_{21}$-$M_{24}$, shown in FIG. 3, take the place of transistor $M_7$, shown in FIG. 1. Transistors $M_{25}$ and $M_{26}$ take the place of transistor $M_1$. Transistor $M_{27}$ takes the place of transistor $M_2$. Transistors $M_{28}$-$M_{31}$ form a cascode current mirror which takes the place of the current mirror formed by transistors $M_3$ and $M_4$. Transistors $M_{28}$ and $M_9$ preferably have low $V_T$'s structure shown in FIG. 1 can obviously be flipped over with N-channel Transistors $M_{21}$-$M_{24}$ and $M_{32}$-$M_{35}$ form a cascode current mirror which takes the place of the current mirror formed by transistors $M_6$-$M_8$. Transistors $M_{36}$ and $M_{37}$ take the place of transistor $M_5$. Transistor $M_{36}$ preferably has a low $V_T$. Capacitor $C_2$ is a compensation capacitor. Transistors $M_{38}$-$M_{42}$ form a start-up circuit which forces the bias circuit to operate in the proper region. Transistors $M_{43}$-$M_{45}$ form an output switch. Transistors $M_{42}$ and $M_{45}$ serve as capacitors.

Table 1 itemizes the critical components of the second preferred embodiment shown in FIG. 3. As an illustration and not a limitation, the designations and electrical parameters are included.

TABLE I

| REFERENCE NUMBER | DESIGNATION | DESCRIPTION |
|---|---|---|
| $M_{21}$ | Transistor | W = 48 μm, L = 12 μm |
| $M_{22}$ | Transistor | W = 48 μm, L = 12 μm |
| $M_{23}$ | Transistor | W = 48 μm, L = 4 μm |
| $M_{24}$ | Transistor | W = 48 μm, L = 4 μm |
| $M_{25}$ | Transistor | W = 56 μm, L = 8 μm |
| $M_{26}$ | Transistor | W = 56 μm, L = 8 μm |
| $M_{27}$ | Transistor | W = 56 μm, L = 8 μm |
| $M_{28}$ | Transistor | W = 48 μm, L = 4 μm |
| $M_{29}$ | Transistor | W = 48 μm, L = 4 μm |
| $M_{30}$ | Transistor | W = 48 μm, L = 20 μm |
| $M_{31}$ | Transistor | W = 48 μm, L = 20 μm |
| $M_{32}$ | Transistor | W = 48 μm, L = 12 μm |
| $M_{33}$ | Transistor | W = 48 μm, L = 4 μm |
| $M_{34}$ | Transistor | W = 48 μm, L = 12 μm |
| $M_{35}$ | Transistor | W = 48 μm, L = 4 μm |
| $M_{36}$ | Transistor | W = 48 μm, L = 4 μm |
| $M_{37}$ | Transistor | W = 48 μm, L = 20 μm |
| $M_{38}$ | Transistor | W = 2.4 μm, L = 60 μm |
| $M_{39}$ | Transistor | W = 2.4 μm, L = 60 μm |
| $M_{40}$ | Transistor | W = 8 μm, L = 1.6 μm |
| $M_{41}$ | Transistor | W = 48 μm, L = 20 μm |
| $M_{42}$ | Transistor | W = 1600 μm, L = 1 μm |
| $M_{43}$ | Transistor | W = 2.4 μm, L = 12 μm |
| $M_{44}$ | Transistor | W = 4 μm, L = 1 μm |
| $M_{45}$ | Transistor | W = 1600 μm, L = 1 μm |
| $C_2$ | Capacitor | 5 pF |

Figure 4:
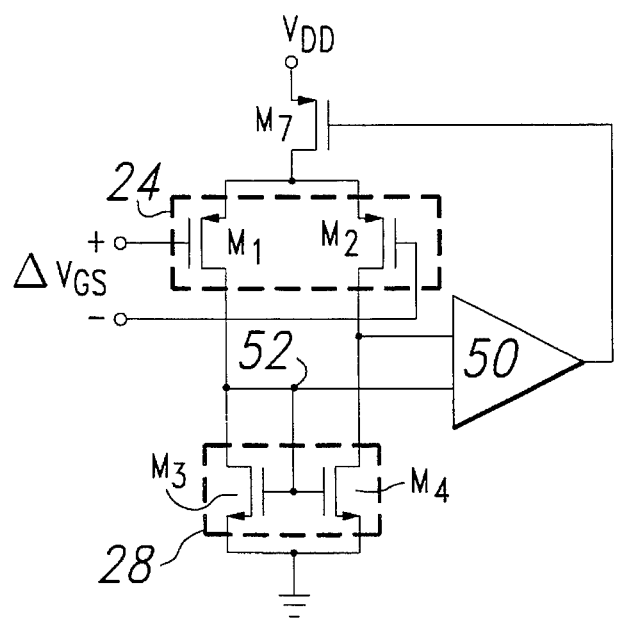
FIG. 4 is a schematic diagram of a third preferred embodiment bias current circuit.

The third preferred embodiment, shown in FIG. 4, operates similar to the first preferred embodiment, shown in FIG. 1. Transistors $M_1$-$M_4$ and $M_7$ are the same as in FIG. 1. Transistors M5 and M6 of FIG. 1 have been replaced by amplifier 50 in FIG. 4. Amplifier 50 has an optional connection to node 52. Transistor $M_7$ serves as a controllable current source that is controlled by the output of amplifier 50. An output current can be mirrored from any of transistors $M_7$, $M_3$, and $M_4$.

This invention provides several advantages. One advantage of this invention is that it is insensitive to body effect of transistors. Another advantage is that it can generally be used to control behavior of the drain saturation voltage of transistors.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit for generating current comprising:

a controllable current source;

an input transistor pair having a first branch and a second branch, the controllable current source is coupled to the first and second branches of the input transistor pair;

a current mirror having a first branch and a second branch, the first branch of the current mirror is coupled to the first branch of the input transistor pair, the second branch of the current mirror is coupled to the second branch of the input transistor pair, the input transistor pair is coupled between the controllable current source and the current mirror; and an amplifier having an output coupled to the controllable current source, a first input coupled to the second branch of the input transistor pair and the second branch of the current mirror, and a second input coupled to the first branch of the input transistor pair and the first branch of the current mirror.

2. The circuit of claim 1 wherein the controllable current source is a transistor.

3. A circuit for generating current comprising:

a first current mirror having a first branch, a second branch, and a third branch;

an input transistor pair having a first branch and a second branch, the first branch of the first current mirror is coupled to the first and second branches of the input transistor pair;

a second current mirror having a first branch and a second branch, the first branch of the second current mirror is coupled to the first branch of the input transistor pair, the second branch of the second current mirror is coupled to the second branch of the input transistor pair, the input transistor pair is coupled between the first current mirror and the second current mirror;

a first transistor having a first terminal, a second terminal, and a control terminal, the first terminal of the first transistor is coupled to the second branch of the first current mirror, the control terminal of the first transistor is coupled to the second branch of the input transistor pair and the second branch of the second current mirror; and a start up circuit coupled to the first terminal of the first transistor.

4. The circuit of claim 3 wherein the first current mirror comprises:

a second transistor having a control terminal, the second transistor forms the first branch of the first current mirror;

a third transistor having a control terminal, the third transistor forms the second branch of the first current mirror, the control terminal of the third transistor is coupled to the first transistor and the control terminal of the second transistor; and a fourth transistor having a control terminal, the fourth transistor forms the third branch of the first current mirror, the control terminal of the fourth transistor is coupled to the control terminal of the third transistor.

5. The circuit of claim 4 wherein the second, third, and fourth transistors are the same size.

6. The circuit of claim 3 wherein the input transistor pair comprises:

a second transistor which forms the first branch of the input transistor pair; and a third transistor which forms the second branch of the input transistor pair.

7. The circuit of claim 6 wherein an input voltage is applied between a control terminal of the second transistor and a control terminal of the third transistor.

8. The circuit of claim 3 wherein the second current mirror comprises:

a second transistor having a control terminal, the second transistor forms the first branch of the second current mirror, the control terminal of the second transistor is coupled to the first branch of the input transistor pair; and a third transistor having a control terminal, the third transistor forms the second branch of the second current mirror, the control terminal of the third transistor is coupled to the control terminal of the second transistor.

9. The circuit of claim 8 wherein the second and third transistors are the same size.

10. The circuit of claim 3 further comprising a capacitor coupled between the second branch of the first current mirror and the second branch of the second current mirror.

11. A circuit for generating current comprising:

a first current mirror having a first branch, a second branch, and a third branch, the first branch of the first current mirror has a first terminal and a second terminal, the second branch of the first current mirror has a first terminal and a second terminal, and the third branch of the first current mirror has a first terminal and a second terminal;

an input transistor pair having a first branch and a second branch, the first branch of the input transistor pair has a first terminal and a second terminal, and the second branch of the input transistor pair has a first terminal and a second terminal, the first terminal of the first branch of the first current mirror is coupled to the first terminal of both the first and second branches of the input transistor pair;

a second current mirror having a first branch and a second branch, the first branch of the second current mirror has a first terminal and a second terminal, and the second branch of the second current mirror has a first terminal and a second terminal, the first terminal of the first branch of the second current mirror is coupled to the second terminal of the first branch of the input transistor pair, the first terminal of the second branch of the second current mirror is coupled to the second terminal of the second branch of the input transistor pair;

a first transistor having a first terminal, a second terminal, and a control terminal, the first terminal of the first transistor is coupled to the first terminal of the second branch of the first current mirror, the control terminal of the first transistor is coupled to the first terminal of the second branch of the second current mirror; and a start up circuit coupled to the first terminal of the first transistor.

12. The circuit of claim 11 wherein the second terminals of the first, second, and third branches of the first current mirror are coupled together.

13. The circuit of claim 11 further comprising a control terminal of the first current mirror coupled to the first terminal of the second branch of the first current mirror.

14. The circuit of claim 11 wherein the second terminals of the first and second branch of the second current mirror are coupled together.

15. The circuit of claim 11 further comprising a control terminal of the second current mirror coupled to the first terminal of the first branch of the second current mirror.

16. The circuit of claim 11 wherein the second terminal of the first transistor is coupled to the second terminal of the second branch of the second current mirror.

17. The circuit of claim 11 further comprising a control terminal of the first branch of the input transistor pair and a control terminal of the second branch of the input transistor pair, an input voltage is coupled between the control terminal of the first branch of the input transistor pair and the control terminal of the second branch of the input transistor pair.

18. The circuit of claim 11 further comprising an output switch coupled to the first terminal of the third branch of the first current mirror.

* * * * *